US 9,429,975 B2

(12) United States Patent
Alon et al.

(10) Patent No.: US 9,429,975 B2
(45) Date of Patent: Aug. 30, 2016

(54) BAND-GAP REFERENCE CIRCUIT FOR BIASING AN RF DEVICE

(71) Applicant: Skyworks Solutions, Inc., Woburn, MA (US)

(72) Inventors: Ziv Alon, Thousand Oaks, CA (US); Aleksey A. Lyalin, Thousand Oaks, CA (US); Jing Sun, Portland, OR (US); Tin Wai Kwan, Thousand Oaks, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/739,609

(22) Filed: Jun. 15, 2015

(65) Prior Publication Data

US 2015/0365112 A1 Dec. 17, 2015

Related U.S. Application Data

(60) Provisional application No. 62/012,777, filed on Jun. 16, 2014.

(51) Int. Cl.
*G05F 3/26* (2006.01)
*G05F 3/20* (2006.01)

(52) U.S. Cl.
CPC ................ *G05F 3/267* (2013.01); *G05F 3/20* (2013.01)

(58) Field of Classification Search
CPC . H04B 2001/0408; G05F 3/26; G05F 3/267; H03F 3/20; H03F 1/30
See application file for complete search history.

(56) References Cited

U.S. PATENT DOCUMENTS

| 4,320,352 | A | 3/1982 | Rubin et al. | |
|---|---|---|---|---|
| 6,043,714 | A | 3/2000 | Yamamoto et al. | |
| 6,242,986 | B1 | 6/2001 | Adar | |
| 6,486,724 | B2 | 11/2002 | Sakamoto et al. | |
| 6,617,928 | B2 | 9/2003 | Finlay et al. | |
| 7,400,202 | B2 | 7/2008 | Yamamoto et al. | |
| 7,417,507 | B2 | 8/2008 | Yamamoto et al. | |
| 7,522,001 | B2 | 4/2009 | Yamamoto et al. | |
| 7,869,775 | B2* | 1/2011 | Alon | H03F 1/0261 455/127.1 |
| 8,008,970 | B1* | 8/2011 | Homol | H03F 3/72 330/296 |
| 8,797,094 | B1* | 8/2014 | Washburn | G05F 1/1561 323/313 |
| 2002/0084853 | A1* | 7/2002 | Finlay | H03F 1/302 330/288 |
| 2005/0088237 | A1* | 4/2005 | Gamero | H03F 1/0222 330/289 |
| 2006/0186962 | A1 | 8/2006 | Apel et al. | |
| 2008/0102759 | A1* | 5/2008 | Alon | H03F 1/0261 455/73 |

OTHER PUBLICATIONS

Butler et al., "Low-Voltage Bandgap Reference Design Utilizing Schottky Diodes" IEEE in 48th Midwest Symposium on Circuits and Systems, Aug. 2005, 5 pages.

* cited by examiner

*Primary Examiner* — Nguyen Vo
(74) *Attorney, Agent, or Firm* — Knobbe Martens Olson & Bear LLP

(57) ABSTRACT

A voltage reference circuit implemented in GaAs to provide an output voltage component proportional to absolute temperature is described herein. The various embodiments of the voltage reference circuit described here can be used to provide precision voltage to bias a RF device. The voltage reference circuit can be provided on the same die as the RF device. The various embodiments described herein can be implemented in a GaAs material system.

20 Claims, 12 Drawing Sheets

BAND-GAP REFERENCE CIRCUIT FOR BIASING AN RF DEVICE

CROSS-REFERENCE TO RELATED APPLICATIONS

The present application claims benefit under 35 U.S.C. §119(e) of U.S. Provisional Application No. 62/012,777, filed on Jun. 16, 2014 and titled "Band-Gap Reference Circuit for Biasing a RF Device." The disclosure of the above identified provisional patent application is incorporated by reference herein in its entirety.

BACKGROUND

1. Field

This disclosure generally relates to the field of RF devices implemented on Gallium Arsenide (GaAs) platform. The disclosure particularly relates to circuits that can provide bias voltages to RF devices.

2. Description of the Related Art

Portable communication devices, such as cellular telephones, use one or more power amplifiers to amplify an information signal prior to transmission. One of the technologies used to fabricate a power amplifier for a portable communication device uses the gallium arsenide (GaAs) material system. Biasing circuits are used to provide appropriate voltage and current to the power amplifier, such that the power amplifiers can be operated with low noise figure, proper quiescent current and good linearity. The bias circuit can also provide voltage and current that are consistent across different parts and over temperature and process variations.

SUMMARY

Embodiments described herein include a voltage reference circuit implemented in GaAs to provide an output voltage component proportional to absolute temperature, the output voltage component being independent of Schottky diode variations.

Embodiments described herein also include a circuit assembly including a voltage reference circuit implemented in GaAs to provide an output voltage component proportional to absolute temperature, the output voltage component being independent of Schottky diode variations which is connected to a current mirror circuit configured to generate a bias voltage for inputting to a RF device. In various embodiments, a mirror shut-off circuit configured to turn-off the current mirror circuit is also described. The mirror shut-off circuit can include a bipolar transistor; a first field effect transistor (FET); a first FET current source, said first FET current source including a second FET; and a second FET current source, said second FET current source including a third FET, wherein the source of the first FET current source and the drain of the second FET current source are connected to the gate of the first FET.

One innovative aspect of the disclosure is implemented in a voltage reference circuit, comprising: an enable circuit configured to receive an input signal; a bandgap voltage generator operatively associated with the enable circuit; a precision voltage generator operatively associated with the bandgap voltage generator to provide an output voltage component proportional to absolute temperature; and a mode-control circuit operatively associated with the bandgap voltage generator and configured to operate the bandgap voltage generator in a low power mode. The output voltage component generated by the bandgap voltage generator can be independent of Schottky diode variations.

In various implementations, the precision voltage generator can include a first bipolar transistor and a second bipolar transistor. The base of the second bipolar transistor can be connected to the base of the first bipolar transistor. The precision voltage generator can further include a field effect transistor (FET). The source of the FET can be connected to the base of the first bipolar transistor and to the base of the second bipolar transistor. The collector of the first bipolar transistor can be connected to the gate of the FET. The voltage reference circuit can be implemented in a gallium arsenide (GaAs) semiconductor die. In various embodiments, the semiconductor die can be incorporated onto a module or system where the semiconductor die is the only semiconductor die (e.g., a system or module with a single GaAs die). The system or module according to certain embodiments may include a GaAs semiconductor die (e.g., a single GaAs) without including a separate complementary metal-oxide (CMOS) controller, such as a CMOS controller for generating bias voltages or bias control signals. In various embodiments, the semiconductor die implements a General-purpose input/output (GPIO)-compliant system.

One innovative aspect of the disclosure is implemented in an apparatus comprising: a voltage reference circuit configured to generate an output voltage component proportional to absolute temperature; and a current mirror circuit configured to receive a precision voltage from the voltage reference circuit that is independent of Schottky diode variations. The current mirror circuit can be further configured to generate a bias voltage for inputting to a RF device. The bias voltage generator can be implemented in a GaAs semiconductor die. The GaAs semiconductor die including the bias voltage generator can be implemented in a semiconductor module.

The apparatus can further comprise a mirror shut-off circuit comprising: a bipolar transistor; a first field effect transistor (FET); a first FET current source including a second FET; and a second FET current source including a third FET. The source of the first FET current source and the drain of the second FET current source can be connected to the gate of the first FET. The mirror shut-off circuit can be configured to turn-off a current mirror circuit configured to receive a precision voltage from a voltage reference circuit that is configured to generate an output voltage component proportional to absolute temperature. The precision voltage can be independent of Schottky diode variations, the current mirror circuit being configured to generate a bias voltage for inputting to a RF device. The base of the bipolar transistor and drain of the first FET current source can each be connected to an enable port. The mirror circuit can be configured to be turned off when a voltage equal to or less than approximately 1 V is applied to the enable port.

Various embodiments described herein include a current mirror circuit assembly comprising: a current mirror circuit; and a mirror shut-off circuit including a first field effect transistor (FET), a first FET current source including a second FET, and a second FET current source including a third FET. The source of the first FET current source and the drain of the second FET current source connected to the gate of the first FET.

Various embodiments described herein include a module comprising: a substrate for receiving a plurality of components; and a GaAs die situated on the substrate. The GaAs die can include a voltage reference circuit implemented to provide an output voltage component proportional to absolute temperature. The output voltage component can be independent of Schottky diode variations. The module can further comprise a current mirror circuit connected to the voltage reference circuit; a RF device connected to the current mirror circuit; and a switch situated on the substrate and connected to the GaAs die.

Various embodiments described herein include a semiconductor die comprising a voltage reference circuit to provide an output voltage component proportional to absolute temperature, the output voltage component being independent of Schottky diode variations; a current mirror circuit connected to the voltage reference circuit; and a RF device connected to the current mirror circuit. In various embodiments, the semiconductor die includes a GaAs material system. In various embodiments, the semiconductor die can be incorporated onto a module or system where the semiconductor die is the only semiconductor die (e.g., a system or module with a single GaAs die). The system or module according to certain embodiments may include a GaAs semiconductor die (e.g., a single GaAs) without including a separate complementary metal-oxide (CMOS) controller, such as a CMOS controller for generating bias voltages or bias control signals. In various embodiments, the semiconductor die implements a General-purpose input/output (GPIO)-compliant system. Various implementations of the semiconductor die can further comprise a master enable circuit configured to enable or disable the voltage reference circuit. Various implementations of the semiconductor die can further comprise a current mirror logic circuit configured to enable or disable the current mirror circuit.

Various embodiments described herein include a semiconductor module comprising a GaAs die connected to a switch. The GaAs die can include a voltage reference circuit to provide an output voltage component proportional to absolute temperature, the output voltage component being independent of Schottky diode variations; a current mirror circuit connected to the voltage reference circuit; and a RF device connected to the current mirror circuit.

Various embodiments described herein include a mobile device (e.g., a phone board) comprising a transmitter; an antenna and a semiconductor module configured to receive a signal from the transmitter, the module including a switch; and a GaAs die connected to the switch, the GaAs die including a voltage reference circuit to provide an output voltage component proportional to absolute temperature, the output voltage component being independent of Schottky diode variations. The semiconductor module can further include a current mirror circuit connected to the voltage reference circuit; and a RF device connected to the current mirror circuit. The module is configured to condition the signal received from the transmitter and transmit the signal to the antenna. In various embodiments, the module can condition the signal received from the transmitter at least in part by amplifying the received signal. In various embodiments, the module has a smaller footprint as compared to previous designs and thus can advantageously reduce the size of the mobile device. In various embodiments, the module may improve power efficiency and signal quality. The semiconductor module can include a single GaAs die. The semiconductor module need not include a complementary metal-oxide (CMOS) die.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

Figure 1A:
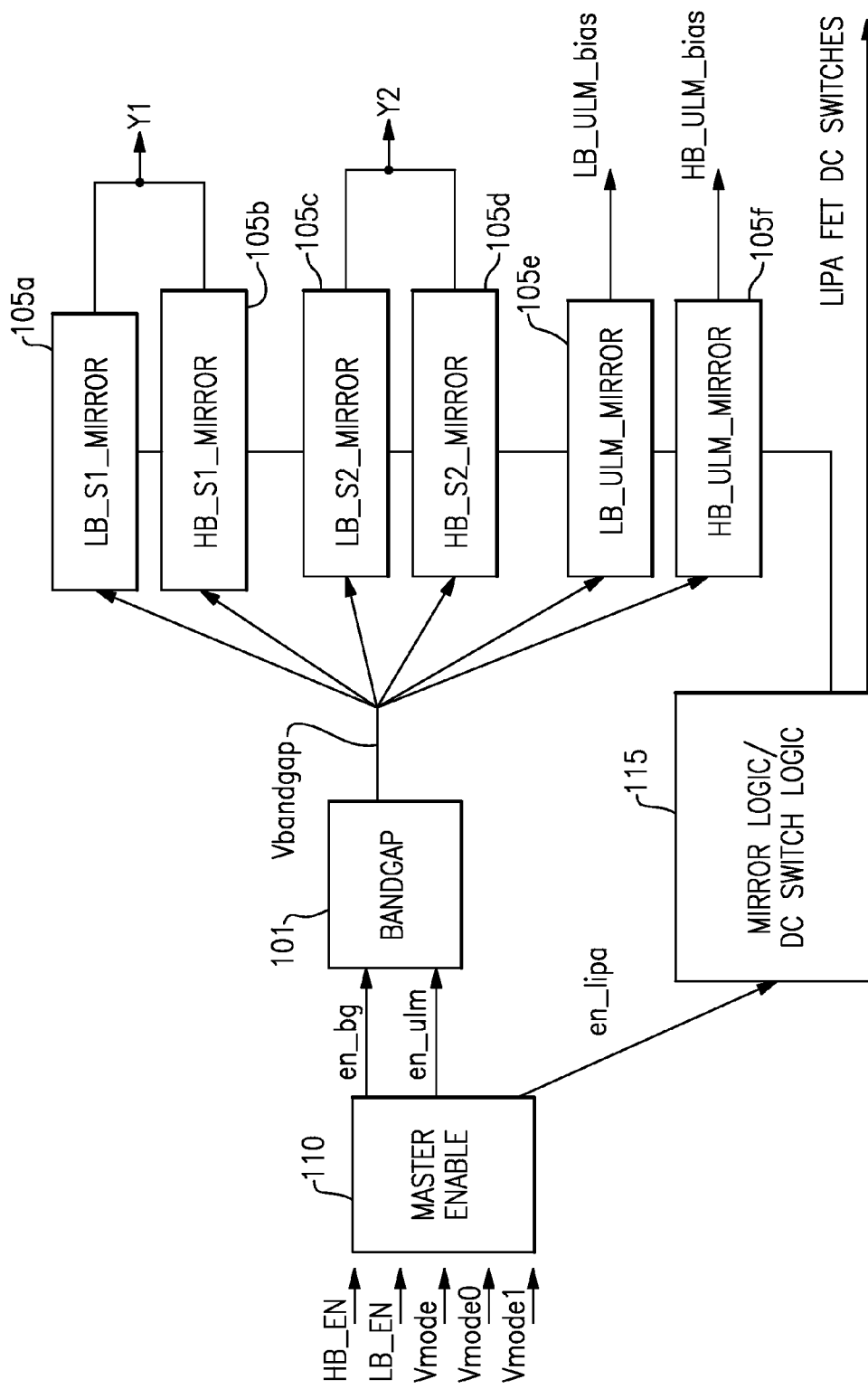
FIG. 1A is a block diagram illustrating the topology of a circuit that provides bias voltage to a RF device.

These and other features will now be described with reference to the drawings summarized above. The drawings and the associated descriptions are provided to illustrate embodiments and not to limit the scope of the disclosure or claims. Throughout the drawings, reference numbers may be reused to indicate correspondence between referenced elements. In addition, where applicable, the first one or two digits of a reference numeral for an element can frequently indicate the figure number in which the element first appears.

DETAILED DESCRIPTION OF THE PREFERRED EMBODIMENT

The features of the systems and methods will now be described with reference to the drawings summarized above. Throughout the drawings, reference numbers are re-used to indicate correspondence between referenced elements. The drawings, associated descriptions, and specific embodiment are provided to illustrate embodiments of the inventions and not to limit the scope of the disclosure.

The embodiments described herein (e.g. the circuit and method for biasing a gallium arsenide (GaAs) power amplifier (also referred to as the GaAs bias circuit)) can be implemented in any GaAs device in which it is desirable to provide a bias voltage. For example, the embodiments described herein can be included in a GaAs semiconductor die implemented on an RF and/or other electronic device (e.g., on a phone board of a mobile phone). The circuits and methods of biasing described herein can be included in a GaAs semiconductor die on an RF electronic device that does not include a CMOS die and/or CMOS controller, such as an RF device including a single GaAs semiconductor die, and no other semiconductor dies. As another example, the implementations of the circuits and method of biasing described herein can be included in a GaAs semiconductor die incorporated onto an RF device, where the GaAs semiconductor die implements a General-purpose input/output (GPIO) communication interface. Further, the circuitry described below can be fabricated using an integrated bipolar-field effect transistor (BIFET) process utilizing the lower turn-on voltage of FET transistors. Further, in particular embodiments, the transistors described below comprise bipolar junction transistors (referred to as a BJT), which includes heterojunction bipolar junction transistors (referred to as an HBT) and field effect transistors (referred to as a FET) that are fabricated using what is referred to as the bipolar complementary metal oxide semiconductor (BIC-MOS) process.

The circuit and method for biasing a gallium arsenide (GaAs) power amplifier are generally implemented in hardware. However, one or more of the signals that control the circuit and method for biasing a gallium arsenide (GaAs) power amplifier can be implemented in software, or a combination of hardware and software. When implemented in hardware, the circuit and method for biasing a gallium arsenide (GaAs) power amplifier can be implemented using specialized hardware elements. When one or more of the control signals for the circuit and method for biasing a gallium arsenide (GaAs) power amplifier are generated at least partially in software, the software portion can be used to precisely control the operating aspects of various components in a bias circuit associated with a device. The software can be stored in a memory and executed by a suitable instruction execution system (microprocessor). The hardware embodiment of the circuit and method for biasing a gallium arsenide (GaAs) power amplifier can include any or a combination of the following technologies, which are all well known in the art: discrete electronic components, discrete logic circuit(s) having logic gates for implementing logic functions upon data signals, an application specific integrated circuit having appropriate logic gates, a programmable gate array(s) (PGA), a field programmable gate array (FPGA), a separate, specially designed integrated circuit for biasing purposes, etc.

The software for the circuit and method for biasing a gallium arsenide (GaAs) power amplifier comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

FIG. 1A is a block diagram illustrating the topology of a circuit that provides bias voltage to one or more RF devices. The circuit block diagram illustrated in FIG. 1A includes a bandgap reference voltage circuit 101, mirror circuits 105a-105f, master enable circuit 110, and a mirror logic circuit 115. The master enable circuit 110 can turn on/off the bandgap reference voltage circuit 101 and the mirror logic circuit 115. The mirror logic circuit 115 can individually turn on/off each of the mirror circuits 105a-105f. Each of the mirror circuits 105a-105f can provide bias voltage to one or more RF devices (e.g. power amplifiers). The RF devices that receive bias voltage from one of the mirror circuits 105a-105f can operate in low or high frequency bands. In various embodiments, the RF devices can be operated in low power mode. The bias voltages/currents provided by the mirror circuits 105a-105f can depend based on whether the RF devices are operating in low or high frequency bands and whether they operate in high/low power mode.

Figure 1B:
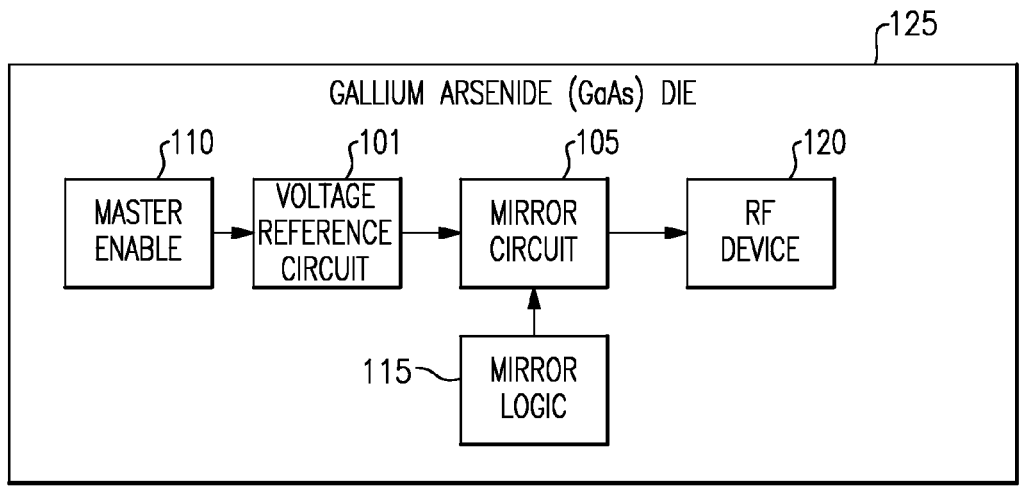
FIG. 1B is a schematic diagram illustrating a GaAs die including a bias reference voltage circuit, current mirror and a RF device.

FIG. 1B is a schematic diagram illustrating a GaAs die 125 including a bias reference voltage circuit (e.g. the bandgap reference voltage circuit 101), current mirror circuit (e.g. the mirror circuits 105a-105f) and a RF device (e.g. a power amplifier) 120. In various embodiments, the GaAs die 125 can also include the mirror logic circuit 115 and/or the master enable circuit 110.

Figure 1C:
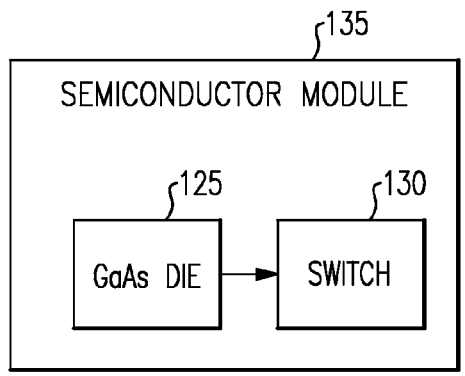
FIG. 1C is a schematic diagram illustrating a semiconductor module including the GaAs die of FIG. 1B and a switch.
Figure 1D:
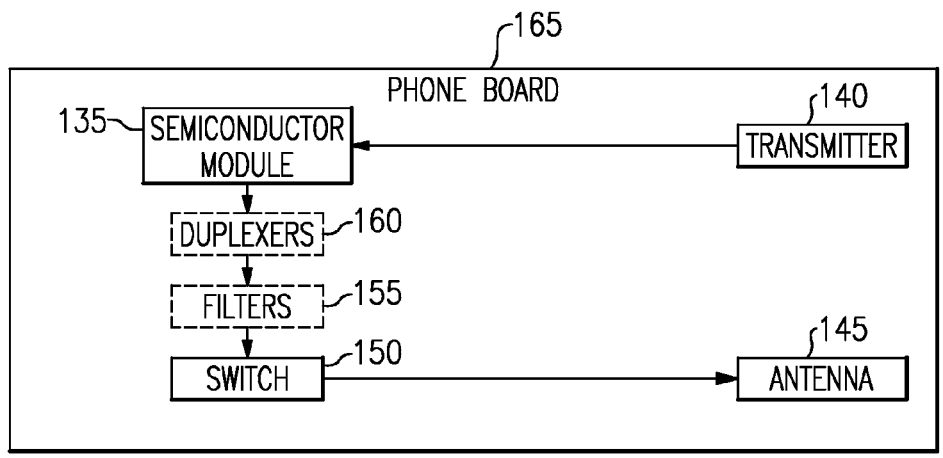
FIG. 1D is a schematic diagram illustrating a phone board including a transmitter, the semiconductor module of FIG. 1C, a switch and an antenna.

FIG. 1C is a schematic diagram illustrating a semiconductor module 135 including the GaAs die 125 of FIG. 1B connected to a switch 130. FIG. 1D is a schematic diagram illustrating a phone board 165 including a transmitter 140 connected to the semiconductor module 135 of FIG. 1C, which is connected to a switch 150, which is connected to an antenna 145. In various embodiments, the phone board 165 may also include filters 155 and duplexers 160 in the circuit path between the semiconductor module 135 and the switch 150. In various embodiments, a switch can be provided between the semiconductor module 135 and the duplexers 160 and/or filters 155.

Figure 2:
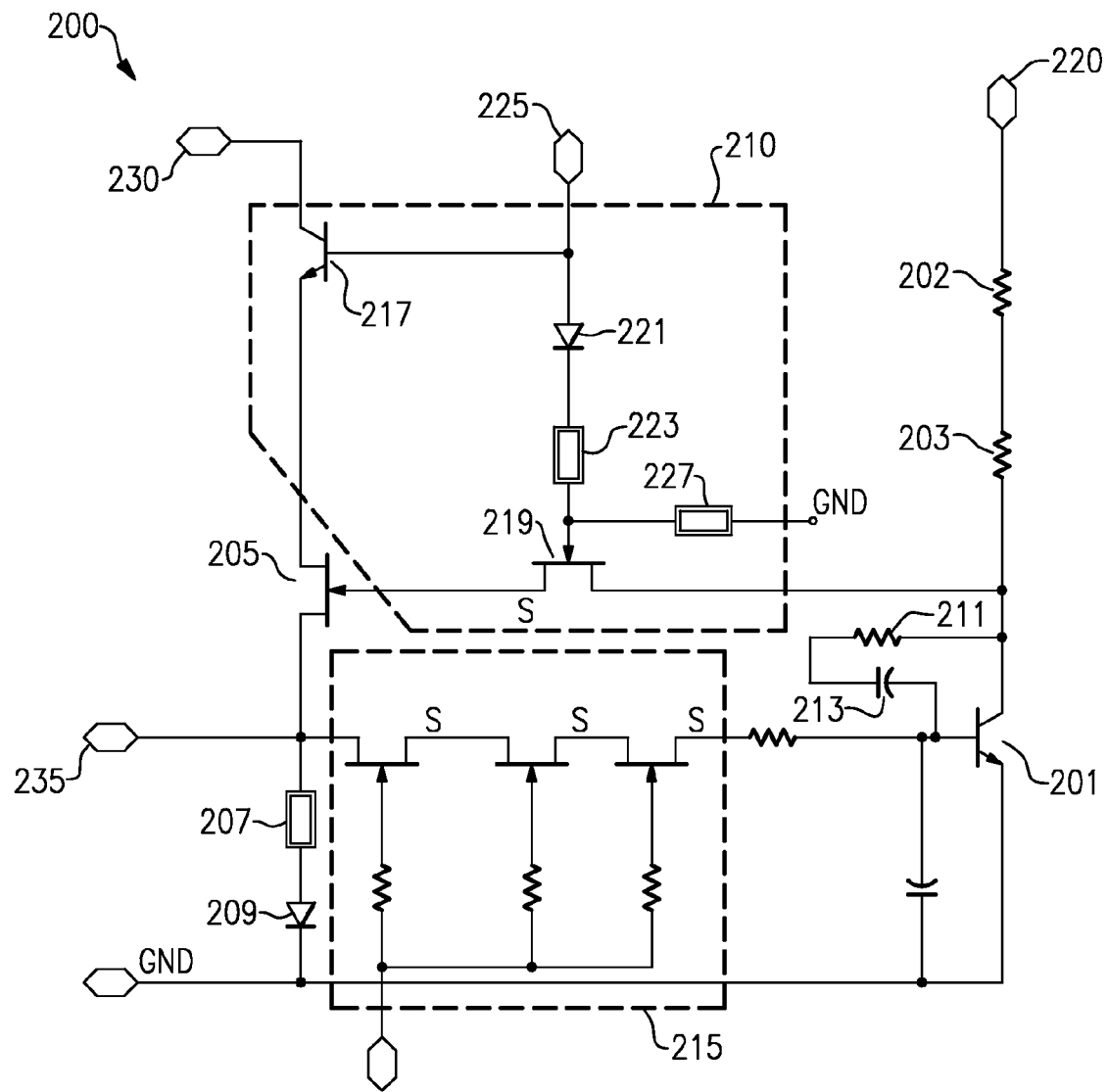
FIG. 2 is a schematic diagram illustrating an embodiment of a current mirror circuit implemented in gallium arsenide (GaAs) material system.

FIG. 2 is a schematic diagram illustrating an embodiment of a current mirror circuit 200. In various embodiments, the current mirror circuit 200 is similar to the mirror circuits 105a-105f of FIG. 1A. In various embodiments, the current mirror circuit 200 is implemented in gallium arsenide (GaAs) material system. The current mirror circuit 200 can reproduce or "copy" the voltage applied at terminal 220, which acts as an input to the current mirror circuit 200, at terminal 235, which acts as an output of the current mirror circuit 200.

The particular embodiment of the current mirror circuit 200 illustrated in FIG. 2 includes a transistor 201 and a field effect transistor (FET) 205 which form the current mirror portion, a current mirror enable/disable portion 210 and an optional compensation circuit 215. In various implementations, the current mirror enable/disable portion 210 and the compensation circuit 215 can together switch on/off the current mirror circuit 200. The compensation circuit 215 can compensate for the series of FET switches in the RF device. In various embodiments, the transistor 201 can be a bipolar junction transistor (BJT) which includes a heterojunction bipolar transistor (HBT). In various embodiments, the FET 205 can include a junction FET (JFET), a metal-oxide-semiconductor FET (MOSFET), or a metal semiconductor FET (MESFET). In various embodiments, the FET 205 can be fabricated using a bipolar-FET semiconductor (BiFET) process.

The transistor 201 and the FET 205 of the current mirror portion are arranged such that the collector terminal of the transistor 201 is connected to the gate terminal of the FET 205. A reference voltage applied to the input terminal 220 is provided to the collector terminal of the transistor 201 and the gate terminal of the FET 205 via one or more resistors 202 and 203. The emitter terminal of the transistor 201 is connected to the ground. In various embodiments, the source terminal of the FET 205 is also connected to the ground through a FET current source 207 and a diode 209. In various embodiments, the collector terminal and the base terminal of the transistor 201 can be connected to each other via an electrical path which includes a resistor 211 and a capacitor 213. The output terminal 235 is connected to the source terminal of the FET 205.

In various embodiments, the transistor 201 mirrors one or more devices (e.g. one or more RF devices) which are located at the output of the node 235. The current mirror circuit 200 operates such that if 'x' mA of current is going through the transistor 201, then 'nx' mA of current will go through the one or more RF devices which are located at the output of the node 235, where 'n' is the ratio of the size (e.g. area) of the transistor 201 and the one or more RF devices. In various embodiments 'n' can have values ranging from 1-100. For example, 'n' can be 1, 2, 5, 10, 20, 25, 50, 75, etc.

In various embodiments, the current through the transistor 201 is determined by the voltage Vref applied at the input terminal 220 and the resistors 202 and 203. If the voltage Vref at the input terminal 220 is a precision voltage, then the current through the transistor 201 is a precision current. One purpose of the current mirror circuit 200 is to force a precision current through the transistor 201 which is mirrored at the output terminal 235. The applied reference voltage together with the resistors 202 and 203 forms a precision current source. In various embodiments, the combined sum of the resistances of resistors 202 and 203 can be between 500Ω and 5 kΩ. In various embodiments, the resistor 202 can be a temperature dependent resistor whose resistance is proportional to the temperature (e.g. absolute temperature) of the resistor. In various embodiments, the resistor 203 can be a temperature independent resistor whose resistance remains substantially the same with variation in the temperature of the circuit or the resistor. Including a temperature dependent resistor 202 can be advantageous in maintaining a substantially constant current flowing through the transistor 201. For example, in various embodiments, the voltage input at terminal 220 can be a precision reference voltage that includes a component that is proportional to the absolute temperature. In such implementations, if the value of the resistor 202 can be configured to increase with temperature, then a substantially uniform current can be maintained through the device 201.

The current mirror enable/disable portion 210 includes a transistor 217 and a FET 219. In various embodiments, the transistor 217 and the FET 219 can be similar to the transistor 201 and the FET 205. The current mirror enable/disable portion 210 also includes a diode 221 and FET current sources 223 and 227. The current mirror enable/disable portion 210 has two terminals 230 and 225. In various embodiments, terminal 230 is configured to be connected to a battery. To turn the mirror circuit off terminal 225 is allowed to float at a voltage of 1 V DC or less. When the terminal 225 is allowed to float, the current source 227 dominates and pulls the gate of the FET 219 to ground, while the transistor 217 is off because the voltage at the base of the transistor 217 is less than the required turn-on voltage which is approximately 1.3 V. The source of the FET 219 is maintained at approximately 0.7 V and the drain of the FET 219 is maintained at a voltage between approximately 0.7-2.0 V. As a result, the gate of FET 205 is maintained at a voltage of 0.7 V, while the drain of FET 205 is off since the transistor 217 is off. Accordingly, FET 205 is also off thereby turning the mirror circuit 200 off.

Figure 3:
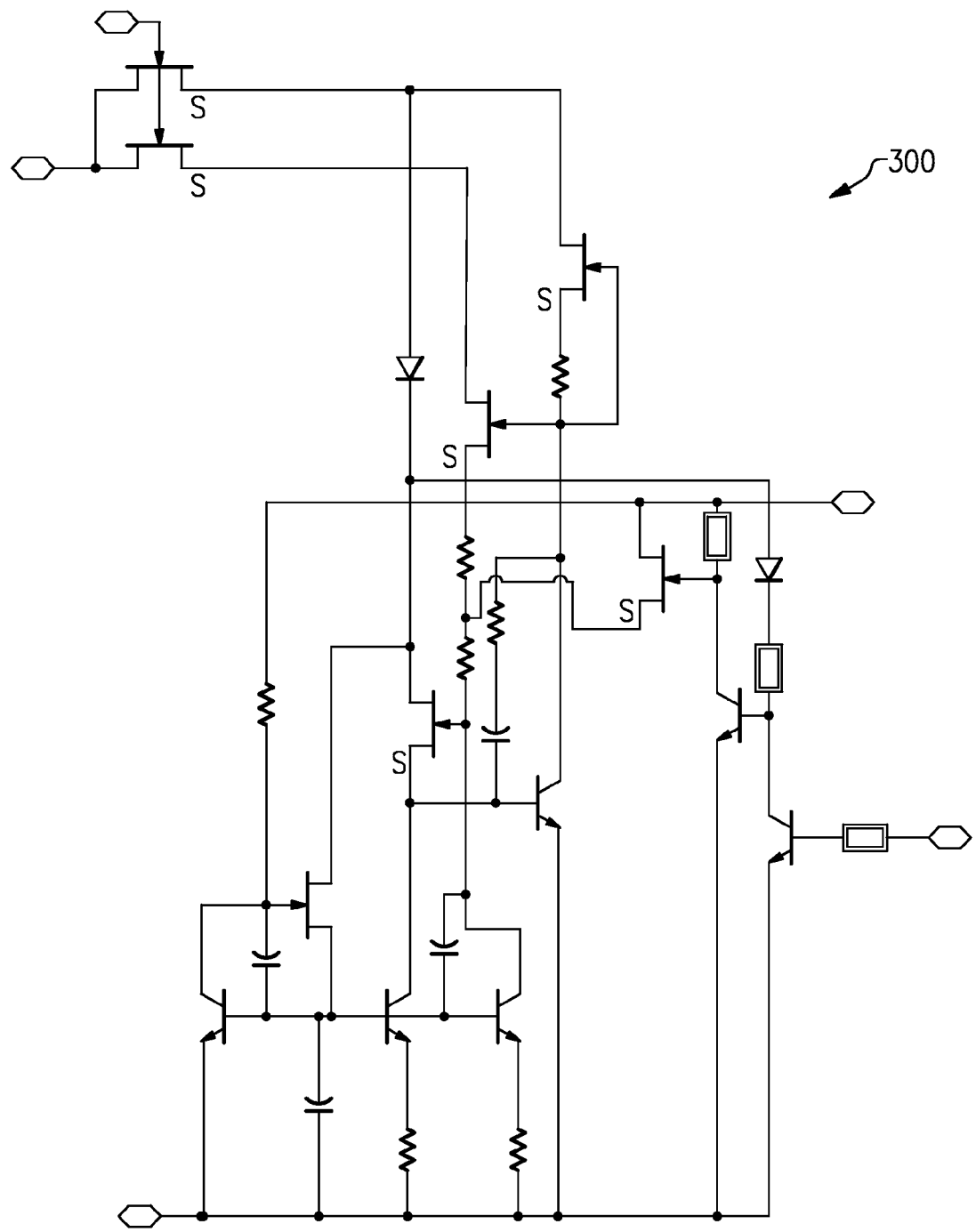
FIG. 3 is a schematic diagram illustrating a voltage reference circuit that provides reference voltage to the current mirror circuit of FIG. 2.

FIG. 3 is a schematic diagram illustrating a voltage reference circuit that provides reference voltage Vref to the current mirror circuit of FIG. 2. The various blocks/portions of the reference voltage circuit 300 illustrated in FIG. 3 are shown in and discussed with respect to FIGS. 4A-4G below. In various embodiments, the voltage reference circuit can be implemented in GaAs material system. In various embodiments, it is advantageous for the voltage reference circuit to rely on the band-gap of the devices used and a voltage proportional to absolute temperature to generate precision voltages instead of using resistors. The embodiments of voltage reference circuits illustrated in FIGS. 4A-4G generate precision voltages that include a first component that depends on the band-gap of the transistors and the FETs that form a part of the circuit and a second component that is proportional to absolute temperature.

Figure 4A:
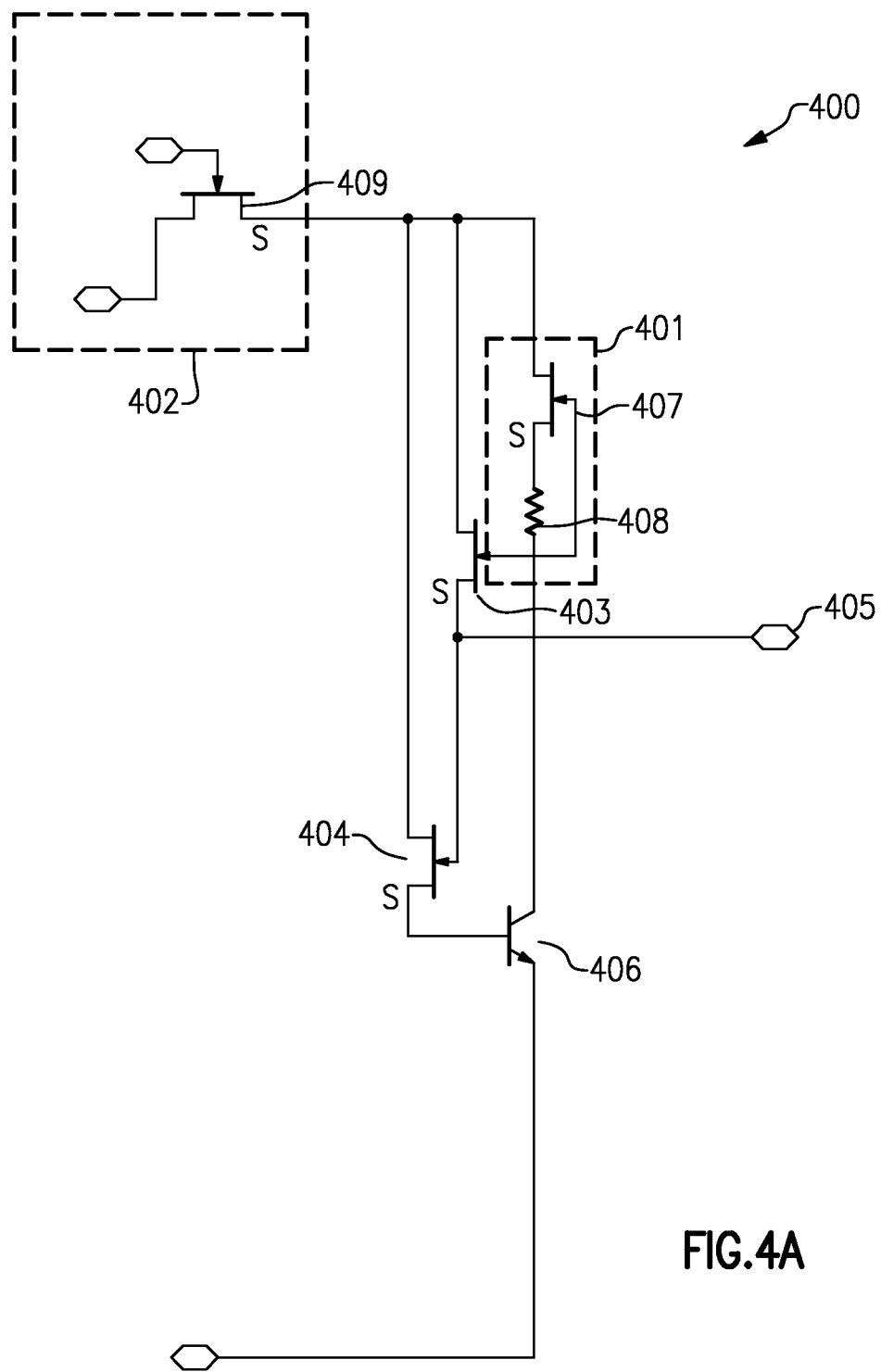
FIGS. 4A-4G schematically illustrate various embodiments of the voltage reference circuit.

FIG. 4A illustrates an embodiment of a voltage reference circuit 400. In various embodiments, the voltage reference circuit 400 can be a simplified version of the voltage reference circuit 300. In various embodiments, the voltage reference circuit illustrated in FIG. 4A can be similar to the biasing circuits described in U.S. Pat. No. 7,869,775, which is incorporated herein by reference in its entirety and made part of this specification. As illustrated in FIG. 4A, the voltage reference circuit 400 includes a FET current source 401, an enable switch 402, a first FET 403, a second FET 404 and a transistor 406. The enable switch 402 includes a third FET 409. In various embodiments, output of the master enable circuit (e.g. 110 of FIG. 1) can be connected to the gate of the FET 409 and a battery can be connected to the drain of the FET 409. In various embodiments, the enable switch can be toggled between on and off states by controlling the voltage applied to the gate of the FET 409. The FET current source 401 is obtained by connecting the source terminal of a FET 407 to a resistor 408. The FETs and the transistors included in the voltage reference circuit 400 can be similar to the FETs and the transistors described above with reference to FIG. 2. The FET 407 included in the FET current source 401 is operated such that Vgs is slightly greater than the cut-off voltage, which is approximately −0.7 V for a FET implemented in GaAs material system. When the enable switch 402 is toggled to turn on the voltage reference circuit 400, a voltage equal to Vbe+Vt is generated at the output terminal 405, where Vbe is the voltage across the base-emitter junction of the transistor 406 and Vt is the turn-on voltage of the FET 404. FETs fabricated on a GaAs platform will turn-off when the gate voltage is approximately 0.7 V below the source voltage, or Vgs is usually −0.7 V. In various embodiments, the voltage reference circuit 400 can be implemented in GaAs material system.

The voltage reference circuit 400 is in feedback wherein the current source 401 is connected to the gate of the FET 403. The source of the FET 403 is connected to the gate of the FET 404. The source of the FET 404 is connected to the base of the transistor 406. The emitter terminal of the transistor 406 is connected to ground. In one particular embodiment where the voltage reference circuit is implemented in GaAs material system, the voltage difference between the base of the transistor 406 and the emitter of the transistor 406 is 1.3 V. In that particular embodiment, the source of the FET 404 is also at 1.3 V, while the gate of the FET 404 is approximately 0.7 V below 1.3 V such that FET 404 is almost turned-off (i.e. the current density through FET 404 is very low). The voltage reference circuit 400 operates such that the voltage at the output terminal 405 is Vbe+Vt, and is relatively stable even though current source 401 may vary by a factor of 2 or more.

Figure 4B:
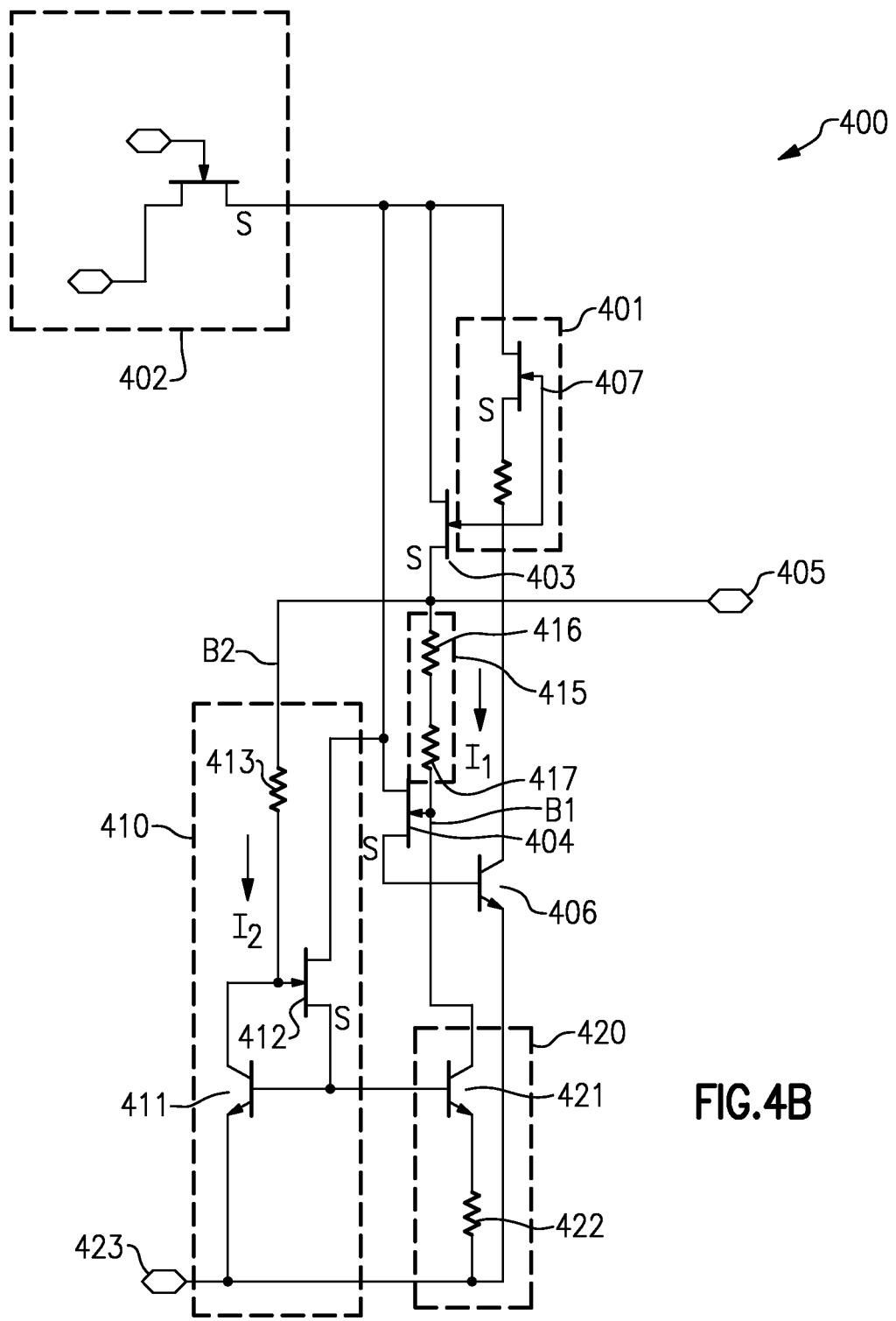

FIG. 4B is an embodiment of a voltage reference circuit 400 that is configured to generate a voltage proportional to the absolute temperature. Without any loss of generality absolute temperature is temperature in degree Kelvin. The voltage reference circuit of FIG. 4B is derived by adding circuit portions 410, 415 and 420 to the voltage reference circuit of FIG. 4A. The circuit portions 410, 415 and 420 provide a voltage proportional to the absolute temperature. The circuit portion 410 includes a transistor 411 (e.g. a HBT), a FET 412 and a resistor 413. The circuit portion 415 includes resistors 416 and 417. The circuit portion 420 includes a transistor 421 (e.g. a HBT) and a resistor 422. The circuit portion 410 is connected such that the drain of the FET 412 is connected to the drain of the FET 404 and the collector of the transistor 411 is connected to the gate of the FET 412. Resistor 413 is connected between the gate of the FET 412 and the source of the FET 403. The circuit portion 415 is connected such that the resistors 416 and 417 are included in the circuit path between the source of the FET 403 and the gate of the FET 404. The circuit portion 420 is connected such that the source of the FET 404 and the collector of the transistor 421 are connected together. The emitter terminals of the transistors 411 and 406 are connected to a common node 423. The emitter terminal of the transistor 421 is connected to the common node 423 via the resistor 422. In various embodiments, the potential at the common node 423 can be maintained at an electrical ground.

The circuit is designed such that the value of the current I1 flowing through the branch B1 is proportional to the value of the current I2 flowing through the branch B2. At 0 degree Kelvin, the voltage at the terminal 405 is approximately Vbe+Vt, but as the temperature increases, the voltage at the terminal 405 will additionally include a component, Vptat, that is proportional to the absolute temperature and to the ratio of the current densities in devices 421 and 411. In various embodiments, the ratio of the current densities in devices 421 and 411 can be 1:10. In some embodiments the ratio of the current densities in devices 421 and 411 can be 1:20, 1:50 or 1:100. In various embodiments, the current densities can be controlled by controlling the area of the devices through which the current flows or the ratios between the resistor 413 and the sum of the resistors 416 and 417. For example, in some embodiments the areas of the devices 411 and 421 can be changed to control the current densities. As another example, in various embodiments, the values of the resistors 413, 416 and 417 are chosen such that the ratio between resistors 413 and series combination of resistors 416 and 417 is fixed. In various embodiments, the fixed ratio can be 10, 20, 50 or 100. In various embodiments, the resistors 416 and 417 can be approximately 25 kΩ each, while the resistor 413 can be approximately 5 kΩ. The voltage reference circuit illustrated in FIG. 4B is in feedback which will eventually reach a steady state such that a voltage Vbe+Vt+Vptat is generated at terminal 405.

Figure 4C:
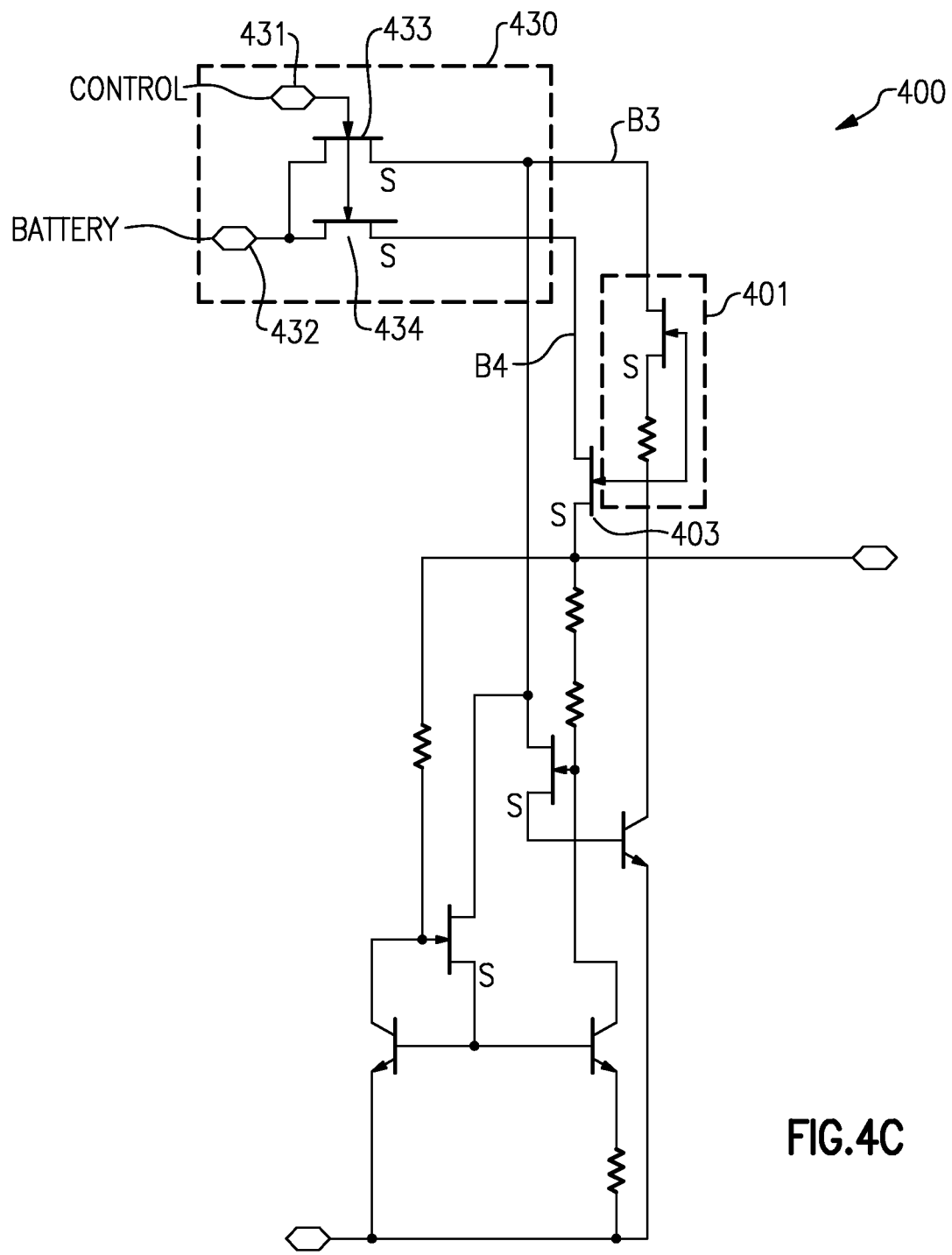

FIG. 4C illustrates an embodiment of a voltage reference circuit 400 that includes a module 430 that can split voltage from a power supply (e.g. a battery) into a low current supply path and a high current supply path for increased 'headroom'. Without any loss of generality the term 'headroom' refers to how much the battery voltage can drop from the nominal value before the circuit stops working. In various embodiments, the module 430 is an alternate embodiment of the enable switch 402 described above. The module 430 includes FETs 433 and 434. The FETs 433 and 434 can be similar to the FETs described above with reference to FIG. 2. In various embodiments, the FET 433 can be similar to the FET 409 described above. In various embodiments, a control circuit (e.g. the master enable circuit 110 illustrated in FIG. 1) can be connected to the input terminal 431 which is connected to the gate of the FETs 433 and 434. In various embodiments, a power supply unit (e.g. a battery) can be connected to the input terminal 433 which is connected to the drain of the FETs 433 and 434. In various embodiments, the battery or the power supply unit is configured to provide approximately 2-5 V. In various embodiments, the voltage at the input terminal 431 can be approximately 0 V in order to turn the circuit off. In various embodiments, the voltage at the input terminal can be approximately equal to the battery voltage in order to turn on the circuit. In the module 430 illustrated in FIG. 4C, branch B3 which includes the current source 401 is a low current path. In various embodiments, the current flowing through the branch B3 is approximately 20 microamperes (μA). In the module 430 illustrated in FIG. 4C, branch B4 including the FET 403 is a medium current path. In various embodiments, the current flowing through the branch B4 is approximately 1-2 milliamperes (mA). An alternate embodiment of the power supply unit 465 configured to provide increased headroom is illustrated in FIG. 4G.

Figure 4D:
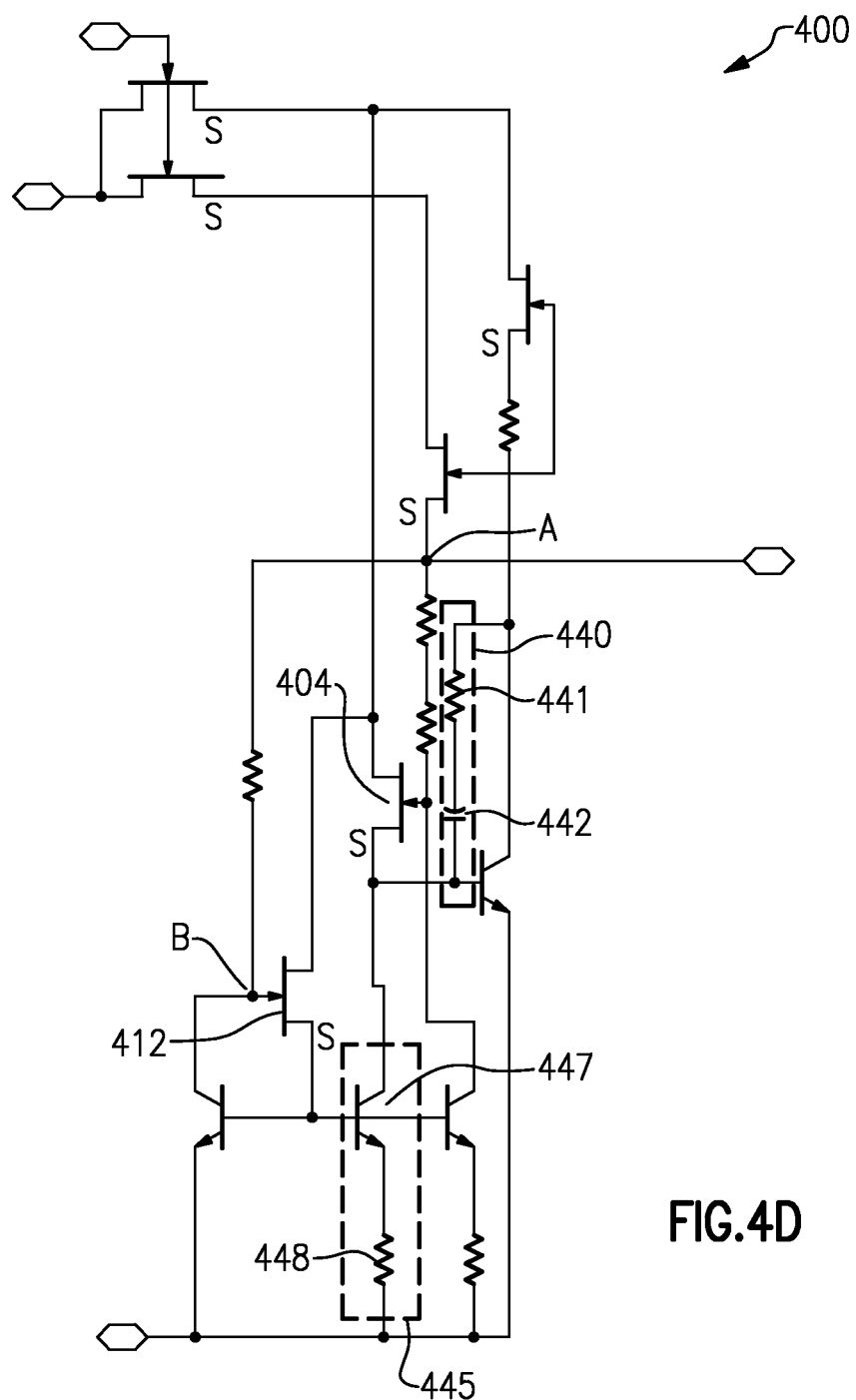

The voltage reference circuit 400 illustrated in FIG. 4D is derived from the voltage reference circuit of FIG. 4C by the inclusion of a compensation circuit 440 and a circuit element 445. In various embodiments, the compensation circuit 440 can be a Miller compensation circuit. In various embodiments, the compensation circuit can improve the stability of the feedback loop in the voltage reference circuit. The compensation circuit 440 includes a resistance 441 and a capacitor 442 connected between the collector and emitter terminals of the transistor 406. The circuit element 445 includes a transistor (e.g. a HBT) 447 and a resistor 448. The circuit element is connected such that the collector terminal of the transistor 447 is connected to the source terminal of FET 404 and the resistor 448 is connected to the emitter terminal of the transistor 447. The circuit element 445 is configured to equalize the current densities flowing through the FETs 412 and 404 such that the voltage at point A and point B as indicated in FIG. 4D are approximately equal. In various embodiments, FET 404 can be smaller in size than FET 412. In various embodiments, the current density through FET 412 could be higher than the current density through FET 404 in the absence of the circuit element 445. In various embodiments, the inclusion of the circuit element 445 can match the current densities through FET 404 and 412.

In various embodiments, it may be desirable to operate the RF device 120 of FIG. 1B at a lower power level and thus it may be desirable to lower the voltage provided by the voltage reference circuit 101 at output terminal 405. In various embodiments, this can be achieved by providing a mode control element 450 such as the one illustrated in FIG. 4E. The mode control element 450 is configured to shunt or short resistor 416 at node A. Shunting or shorting the resistor 416 at node A can lower the component of the bias voltage that is proportional to the absolute temperature, thereby reducing the output bias voltage. The mode control element 450 includes a FET 451, transistors 452 and 453 and FET current sources 454A, 454B, 454C. In various embodiments, mode control element 450 operates as a logic circuit that can accept an incoming voltage from a transceiver circuit (e.g. transmitter 140 of FIG. 1D) corresponding to logic level high of approximately 1.3-5 V or a logic level low of approximately 0-0.5 V and control the voltage provided at the output terminal 425 based on the incoming voltage from the transceiver circuit. In various embodiments, the incoming voltage from the transceiver circuit can be input to terminal 455. The FET current sources 454A-454C can limit the current going into the base of the transistors 452 and 453. In various embodiments, the FETs included in the current sources 454A-454C can have a resistance (Rds) of approximately 300 ohms between the drain and the source terminals.

Figure 4E:
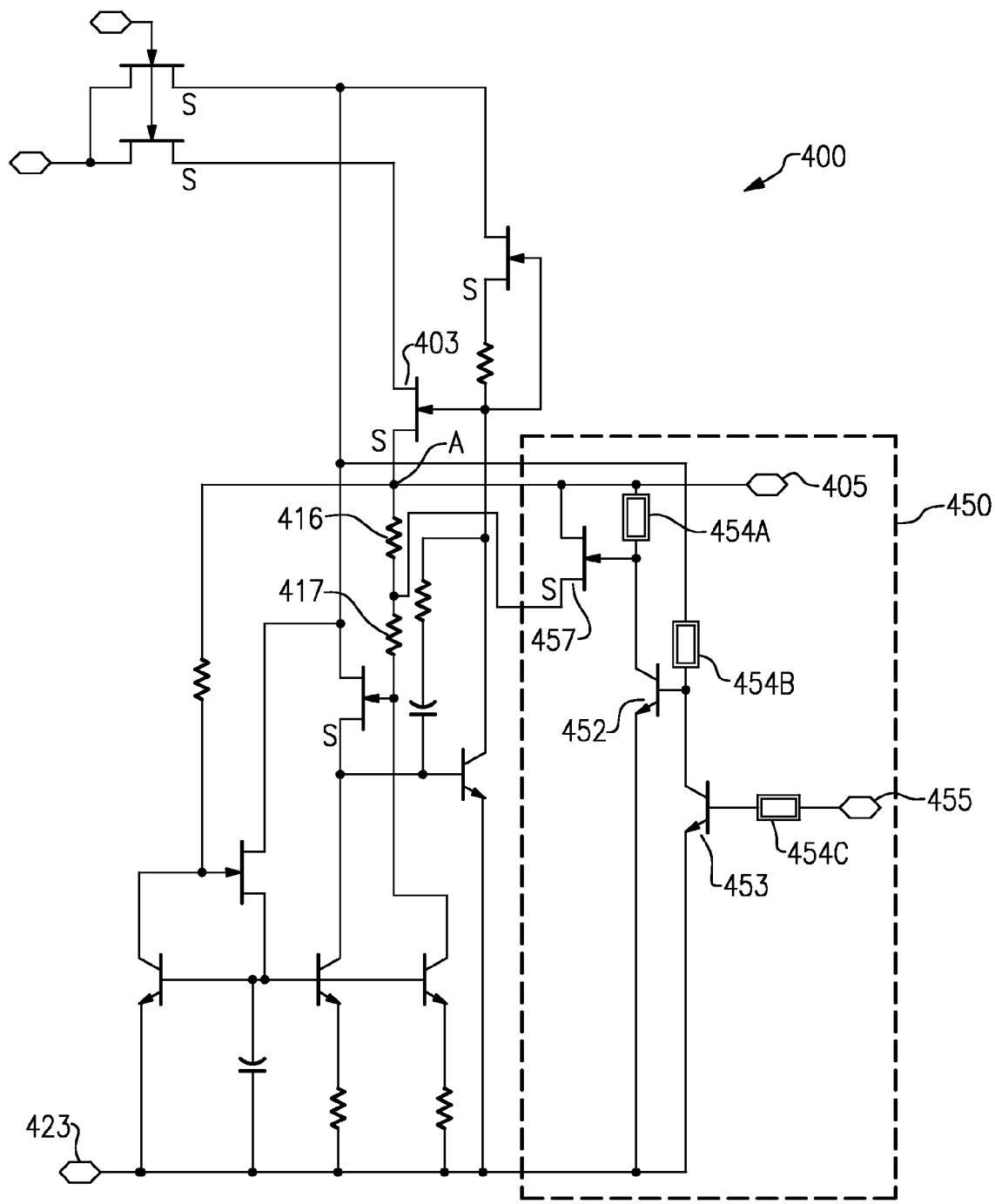

The mode control element 450 illustrated in FIG. 4E is connected such that the drain terminal of the FET 451 is connected to the output terminal 405. The collector terminal of the transistor 452 is also connected to the output terminal 405 via the current source 454A. The collector terminal of the transistor 453 is also connected to the source terminal of the FET 403 via the current source 454B. The input terminal 455 is connected to the base of the transistor 453 via the current source 454C. The collector terminal of the transistor 453 is also connected to the base of the transistor 452. The collector terminal of the transistor 452 is also connected to the gate of the FET 451. The source terminal of the FET 451 is connected to junction between resistors 416 and 417. The emitters of the transistors 452 and 453 can be connected to the node 423.

Figure 4F:
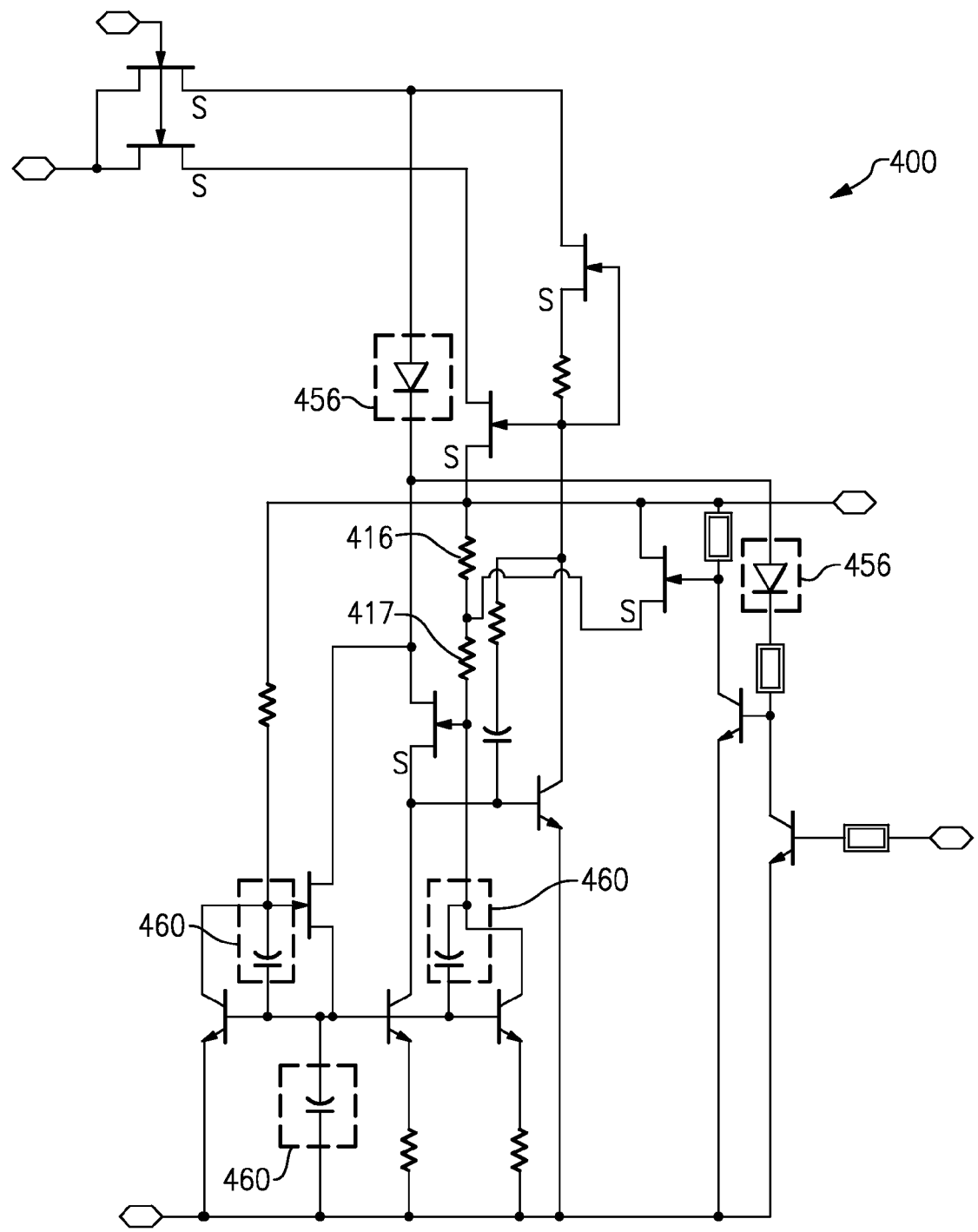
Figure 4G:
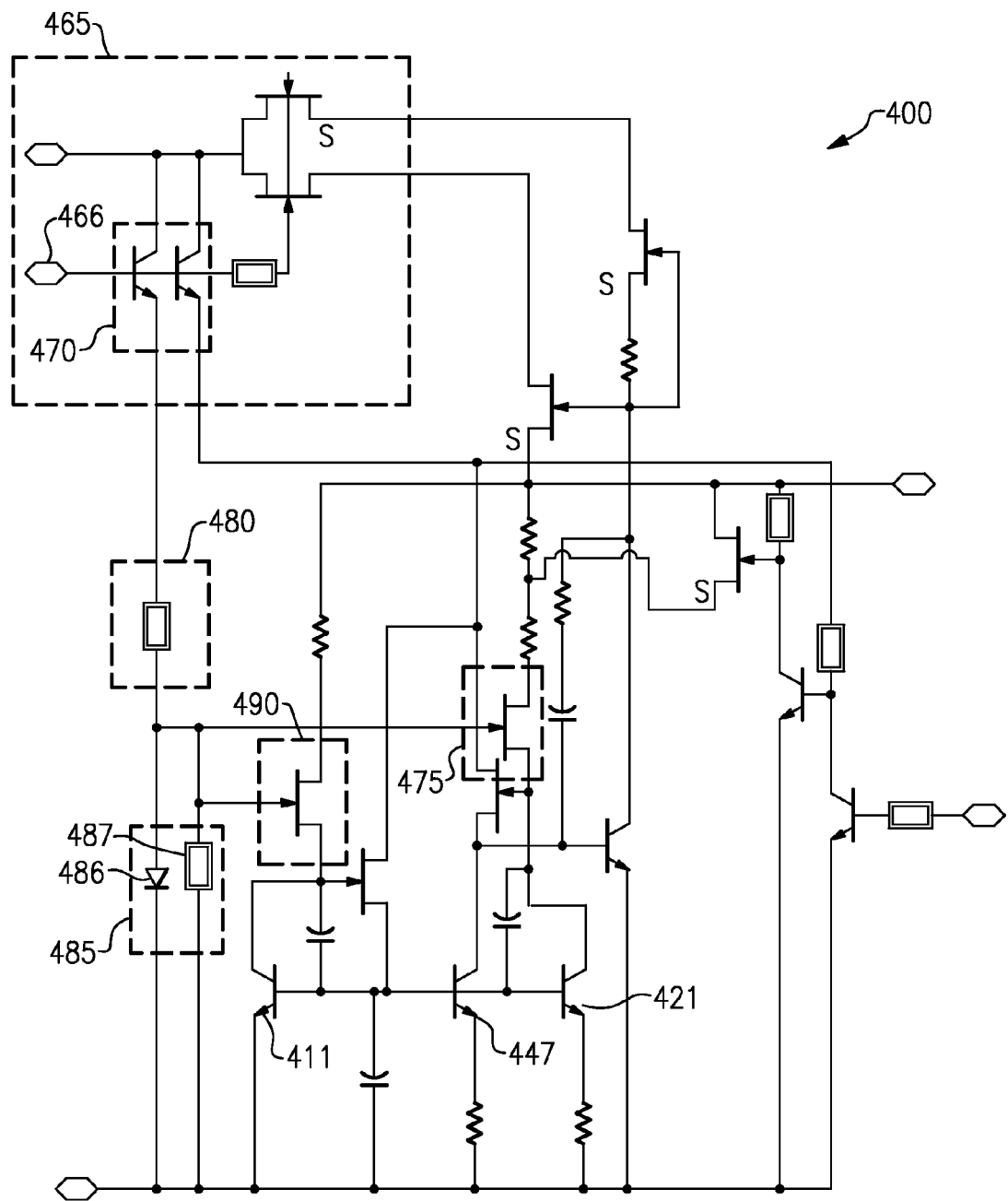

FIG. 4F illustrates an embodiment of the voltage reference circuit 400 including capacitors 460. In various embodiments, the capacitors 460 are connected between the base and the emitter of the transistors thereby preventing the junctions from rectifying. When the voltage reference circuit is provided on the same dies as the RF power amplifier, the RF power from the power amplifier can leak into the voltage reference circuit and change voltage level of the ground terminal. Providing the capacitors 460 can filter the RF power and provide a good ground for the voltage reference circuit.

The circuit illustrated in FIG. 4F also includes leakage diodes 456 which provide a leakage path for the residual voltage between the gate and the source when the circuit is turned off.

FIG. 4G illustrates an embodiment of the voltage reference circuit 400 that is configured to be disabled or turned-off by floating the enable terminal 466 to a voltage that can be as high as 1 V instead of pulling the voltage at the enable terminal 466 down to approximately 0.3 V or lower. The circuit illustrated in FIG. 4G is derived from the circuits illustrated in FIGS. 4A-4F and includes a HBT assembly 470, FET based switches 475 and 490, and a circuit element 485 that includes a diode 486 and a FET based current source 487. When the voltage at the enable terminal 466 is allowed to float to about 1V, the voltage at the emitter terminals 471 and 472 of the BJTs included in the assembly 470 will be approximately 0V, because HBTs require approximately 1.3V to turn on. The current sources 480 and 487 additionally aid in pulling the voltage at the emitter terminals 471 and 472 of the HBTs in down to 0 V by behaving as resistive elements and draining the current. The FETs in the switches 475 and 490 are turned-off as a result of pulling the voltage at the emitter terminals 471 and 472 down to approximately 0 V. The voltage between the gate and the source terminal of the FETs in the switches 475 and 490 can be approximately 0.8 V when the FETs are tuned-off. However, a voltage of 0.8 V is not sufficient to turn on HBT's 411, 447 and 421 which require approximately 1.3 V to turn-on. As a result the entire circuit turns-off when the voltage at the enable terminal is allowed to float. The diode 486 of the element 485 ensures that the FETs in the switches 475 and 490 are not driven hard and do not start conducting. In various embodiments, the diode 486 limits the voltage at the gate terminal of the FETs in the switches 475 and 490 to about 0.7 V.

The FET 205 in the current mirror circuit 200 illustrated in FIG. 2 is configured to provide precision bias voltage and/or current to a large number of RF devices connected to the output terminal 235. In various embodiments, the number of RF devices connected to the output terminal 235 can be between 2 and 200. In order to provide precision bias voltage or "source" a large number of RF devices, the FET 205 should be capable of providing a variable current (e.g. of the order of 0-30 mA). In order to provide a variable current with a bandwidth exceeding 20 MHz, it is desirable for the FET 205 to have at least bandwidth that can support a closed loop circuit bandwidth that exceeds 20 MHz. It is desirable for the FET 205 to have a large area in order to "source" a large number of devices. However, the large area of the FET 205 can result in a reduction in the frequency response of the FET 205.

Figure 5:
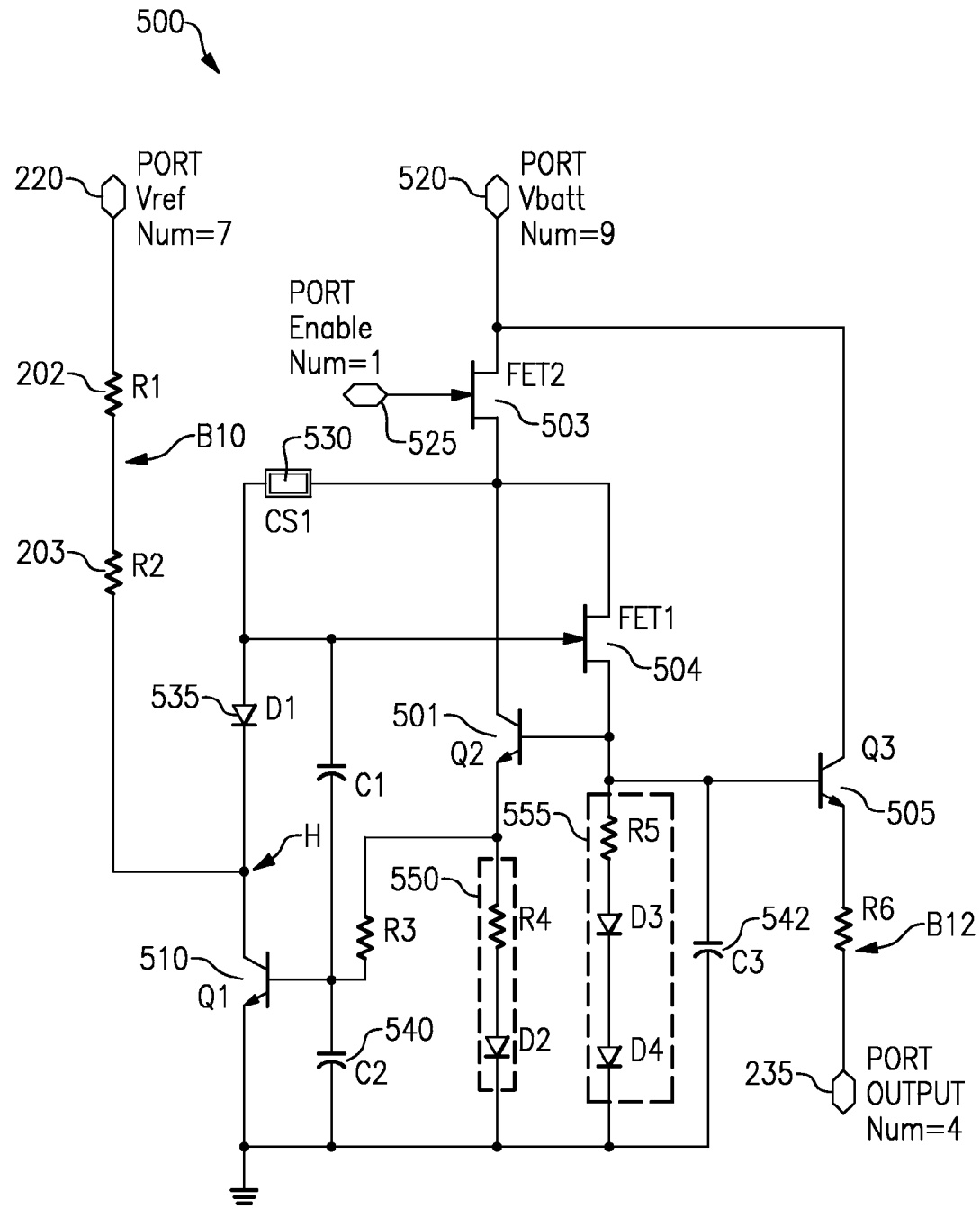
FIG. 5 schematically illustrates an embodiment of a current mirror circuit.

FIG. 5 is an alternate embodiment of the current mirror circuit 200 which can be used in high speed or high bandwidth application (e.g. 4G applications). The current mirror circuit 500 illustrated in FIG. 5 include a transistor 505 which is configured as an emitter follower to provide precision bias voltage and/or current to a large number of RF devices connected to terminal 235 which is connected to the emitter of the transistor 505. A precision bias voltage applied at the input terminal 220 of the current mirror circuit 500 generates a precision current flowing through the branch B10. The value of the current through the branch B10 is determined by the value of the resistors 202 and 203. The current mirror circuit 500 is configured such that the current in an identical device connected at the output terminal 235 is substantially the same as the current through branch B10. The circuit 500 includes a first FET 503 that can switch the current mirror circuit 500 on/off based on the voltage applied at terminal 525 which is connected to the gate of the FET 503. Voltage from a battery source can be applied at terminal 520 which is connected to the drain of the FET 503. The source terminal of the FET 503 is connected to the drain of a second FET 504. The source terminal of the FET 504 is connected to the base of the transistor 501 such that the FET 504 is configured to source the transistors 501 and 510 which constitute a Darlington pair of transistors.

A FET current source 530 and a diode 535 are included in the circuit 500 so as to maintain the voltage at point H at a voltage equivalent to Vbe+Vgs. The circuit 500 includes two capacitors 540 and 542 which are provided to filter out any high frequency voltage or current components that may leak into the circuit 500 from the RF devices that are connected at the output terminal 235 or RF leaking from the ground. The value of the capacitors 540 and 542 can be between 0.5 pF and 2 pF. A resistor 545 having a resistance between 500Ω and 5 kΩ is provided in the current mirror circuit 500. The resistor 545 mirrors the base ballast resistors that are included in the RF devices connected at the output terminal 235. A circuit element 550 including a resistor and a diode is connected to the emitter of the transistor 501. The values of the components of the circuit element 550 are adjusted such that the current densities flowing through the transistors 501 and 505 are substantially the same. A circuit element 555 including a resistor and two diodes is connected to the source of the FET 505. The values of the components of the circuit element 555 are adjusted such that the variation in the current output by the FET 504 can be reduced. For example, the values of the components of the circuit element 555 are adjusted such that the variation in the baseline current output by the FET 504 remains between about 0.75-2 times a baseline current supplied by the FET 504. In the absence of the circuit element 555, the variation in the baseline current supplied by the FET 504 can be about 0.1-10 times. The transistor 505 functions as an emitter follower that can provide a high current and/or a precision bias voltage to a large number of RF devices (e.g. 2-200 RF devices) that are connected at the output terminal 235 connected to the emitter of the transistor 505.

One difference between the current mirror circuit 200 and the current mirror circuit 500 is that the FET 205 of current mirror circuit 200 is replaced with a transistor (e.g. a BJT) 505 in the current mirror circuit 500. The transistor 505 is capable of providing a variable precision current between about 0 to 30 mA to a large number of RF devices with a bandwidth in the excess of 20 MHz.

The FETs in various embodiments of the voltage reference circuits described above and illustrated in FIGS. 3 and 4A-5 can include MESFETs. The sizes of the FETs in various embodiments of the voltage reference circuits described above and illustrated in FIGS. 3 and 4A-4G can vary between 20 μm² and 100 μm². For example, the FET 403 can have a width of 100 μm and a length of 1 μm. As another example, the FET 404 can have a width of 20 μm and a length of 1 μm.

While the foregoing detailed description discloses several embodiments of the present invention, it should be understood that this disclosure is illustrative only and is not limiting of the present invention. It should be appreciated that the specific configurations and operations disclosed can differ from those described above, and that the apparatus and methods described herein can be used in contexts. Additionally, components can be added, removed, and/or rearranged. Additionally, processing steps may be added, removed, or reordered. A wide variety of designs and approaches are possible.

While embodiments have been described with respect to a voltage reference circuit, the disclosed systems and methods apply to any biasing circuit as would be known to one of skill in the art in view of the disclosure herein.

Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The examples described above are merely exemplary and those skilled in the art may now make numerous uses of, and departures from, the above-described examples without departing from the inventive concepts disclosed herein. Various modifications to these examples may be readily apparent to those skilled in the art, and the generic principles defined herein may be applied to other examples, without departing from the spirit or scope of the novel aspects described herein. Thus, the scope of the disclosure is not intended to be limited to the examples shown herein but is to be accorded the widest scope consistent with the principles and novel features disclosed herein. The word "exemplary" is used exclusively herein to mean "serving as an example, instance, or illustration." Any example described herein as "exemplary" is not necessarily to be construed as preferred or advantageous over other examples.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize in view of the disclosure herein.

For example, the voltage reference circuit may be implemented in CMOS or any other material system. Additionally, the voltage reference circuit can be configured to provide precision bias voltage to various devices including RF power amplifier, transmitters, transceivers, etc. In embodiments with more than one current source, the current sources may be variable current sources, fixed current sources, or a combination of variable and mixed current sources. In various embodiments, the current sources can be implemented in GaAs material system using a process similar to the process used to fabricate transistors and FETs. Additionally, the resistors in various embodiments can be fixed or variable and fabricated using a semiconductor process.

For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage reference circuit, comprising:
 a precision voltage generator including a plurality of transistors and configured to provide an output voltage having a first component that depends on a band-gap of the plurality of transistors and a second component that is proportional to absolute temperature, the plurality of transistors including a first bipolar transistor and a second bipolar transistor, a base of the second bipolar transistor connected to a base of the first bipolar transistor;

an enable circuit configured to selectively enable the precision voltage generator based on a voltage of an enable terminal; and a mode-control circuit operatively associated with the precision voltage generator and configured to selectively operate the precision voltage generator in a low power mode based on a voltage of an input terminal.

2. The voltage reference circuit of claim 1 wherein the plurality of transistors of the precision voltage generator further includes a field effect transistor (FET), a source of the FET connected to the base of the first bipolar transistor and to the base of the second bipolar transistor, a collector of the first bipolar transistor connected to a gate of the FET.

3. The voltage reference circuit of claim 1 wherein the voltage reference circuit is implemented in a gallium arsenide (GaAs) semiconductor die.

4. An apparatus comprising:
a voltage reference circuit configured to generate an output voltage having a component proportional to absolute temperature;
a current mirror circuit configured to receive the output voltage and to generate a bias voltage for inputting to a RF device; and
a mirror shut-off circuit configured to selectively enable the current mirror circuit based on a voltage of an enable terminal, the mirror shut-off circuit including a bipolar transistor having a base connected to the enable terminal, a FET, a first FET current source, and a second FET current source, a source of the first FET current source and a drain of the second FET current source connected to a gate of the FET.

5. The apparatus of claim 4 wherein the voltage reference circuit, the current mirror circuit, and the mirror shut-off circuit are implemented in a GaAs semiconductor die.

6. A module incorporating the GaAs semiconductor die of claim 5.

7. The apparatus of claim 4 wherein a drain of the first FET current source is connected to the enable terminal.

8. The apparatus of claim 7 wherein the mirror shut-off circuit is configured to turn off the current mirror circuit when the voltage of the enable terminal is equal to or less than approximately 1 V.

9. The apparatus of claim 4 wherein the voltage reference circuit includes a first bipolar transistor and a second bipolar transistor, a base of the second bipolar transistor connected to a base of the first bipolar transistor.

10. The apparatus of claim 9 wherein the voltage reference circuit further includes a FET, a source of the FET connected to the base of the first bipolar transistor and to the base of the second bipolar transistor, and a collector of the first bipolar transistor connected to a gate of the FET.

11. The apparatus of claim 10 wherein the voltage reference circuit provides the output voltage on an output terminal, the voltage reference circuit further including a resistor connected between the output terminal and the gate of the FET.

12. A semiconductor die comprising:
a voltage reference circuit including a plurality of transistors and configured to provide an output voltage having a first component that depends on a band-gap of the plurality of transistors and a second component that is proportional to absolute temperature;
a current mirror circuit configured to generate a bias voltage based on the output voltage from the voltage reference circuit;
a mirror shut-off circuit configured to selectively enable the current mirror circuit based on a voltage of an enable terminal, the mirror shut-off circuit including a bipolar transistor having a base connected to the enable terminal, a FET, a first FET current source, and a second FET current source, a source of the first FET current source and a drain of the second FET current source connected to a gate of the FET; and
a RF device configured to receive the bias voltage from the current mirror circuit.

13. The semiconductor die of claim 12 implemented in GaAs semiconductor material.

14. The semiconductor die of claim 12 further comprising a master enable circuit configured to enable or disable the voltage reference circuit.

15. A mobile device comprising:
a transmitter for generating an radio frequency (RF) signal;
an antenna configured to direct the generated RF signal out of the mobile device; and
a semiconductor module configured to receive the RF signal from the transmitter, the semiconductor module including a switch and a GaAs die connected to the switch, the GaAs die having a voltage reference circuit configured to provide an output voltage having a component proportional to absolute temperature, the semiconductor module further including a current mirror circuit configured to receive the output voltage and a mirror shut-off circuit configured to selectively enable the current mirror circuit based on a voltage of an enable terminal, the semiconductor module configured to condition the RF signal and to transmit the RF signal to the antenna, the mirror shut-off circuit including a bipolar transistor having a base connected to the enable terminal, a FET, a first FET current source, and a second FET current source, a source of the first FET current source and a drain of the second FET current source connected to a gate of the FET.

16. The mobile device of claim 15 wherein the semiconductor module includes a single GaAs die.

17. The mobile device of claim 15 wherein the semiconductor module does not include a complementary metal-oxide (CMOS) die.

18. The mobile device of claim 17 wherein the semiconductor module is configured to condition the signal at least in part via amplification of the signal.

19. The mobile device of claim 15 wherein the voltage reference circuit includes a first bipolar transistor and a second bipolar transistor, a base of the second bipolar transistor connected to a base of the first bipolar transistor.

20. The mobile device of claim 19 wherein the voltage reference circuit further includes a FET, a source of the FET connected to the base of the first bipolar transistor and to the base of the second bipolar transistor, and a collector of the first bipolar transistor connected to a gate of the FET.

* * * * *